US009269597B2

(12) United States Patent
Fernandez et al.

(10) Patent No.: US 9,269,597 B2
(45) Date of Patent: Feb. 23, 2016

(54) OPEN CAVITY PLASTIC PACKAGE

(71) Applicant: Microchip Technology Incorporated, Chandler, AZ (US)

(72) Inventors: Joseph D. Fernandez, Cha-Cheng-Sao (TH); Sombat Kittiphinijnanta, Cha-Cheng-Sao (TH); Nutthiwut Yamputchong, Cha-Cheng-Sao (TH); Surachai Lertruttanaprecha, Cha-Cheng-Sao (TH); Viwat Maikuthavorn, Cha-Cheng-Sao (TH)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 31 days.

(21) Appl. No.: 14/157,382

(22) Filed: Jan. 16, 2014

(65) Prior Publication Data

US 2014/0206122 A1    Jul. 24, 2014

Related U.S. Application Data

(60) Provisional application No. 61/755,889, filed on Jan. 23, 2013.

(51) Int. Cl.
    *H01L 21/56*      (2006.01)
    *H01L 21/67*      (2006.01)
    *H01L 23/00*      (2006.01)

(52) U.S. Cl.
    CPC ........ *H01L 21/565* (2013.01); *H01L 21/67121* (2013.01); *H01L 23/564* (2013.01); *H01L 2224/45144* (2013.01); *H01L 2224/48091* (2013.01); *H01L 2224/48247* (2013.01); *H01L 2924/1815* (2013.01)

(58) Field of Classification Search
    None
    See application file for complete search history.

(56) References Cited

U.S. PATENT DOCUMENTS

| 2003/0214021 A1 | 11/2003 | Zhou et al. ............. 257/678 |
| 2004/0017000 A1 | 1/2004 | Chiu et al. ............. 257/678 |

FOREIGN PATENT DOCUMENTS

| EP | 0789334 A2 | 8/1997 | .......... G07C 9/00 |
| EP | 1220309 A1 | 7/2002 | .......... G01L 19/14 |
| EP | 2490250 A1 | 8/2012 | .......... B81C 1/00 |
| EP | 2573806 A1 | 3/2013 | .......... H01L 21/56 |
| JP | 04352435 A | 12/1992 | .......... B29C 45/14 |

OTHER PUBLICATIONS

International Search Report and Written Opinion, Application No. PCT/US2014/012512, 13 pages, May 19, 2014.

*Primary Examiner* — Stanetta Isaac
(74) *Attorney, Agent, or Firm* — Slayden Grubert Beard PLLC

(57) ABSTRACT

A method for manufacturing open cavity integrated circuit packages, the method comprising: placing a wire-bound integrated circuit in a mold; forcing a pin to contact a die of the wire-bound integrated circuit by applying a force between the pin and the mold; injecting plastic into the mold; allowing the plastic to set around the integrated circuit to form a package having an open cavity defined by the pin; and removing the open cavity integrated circuit package from the mold. A mold for forming a package for an integrated circuit sensor device, comprising: a bottom part for supporting an integrated circuit die; a top part that is operable to be placed on top of said bottom part to form a cavity into which a plastic material can be injected to form the package, wherein the top part of the mold comprises a spring-loaded pin arrangement comprising a cover that covers a sensor area on the integrated circuit die and provides for an opening when the plastic material is injected.

12 Claims, 6 Drawing Sheets

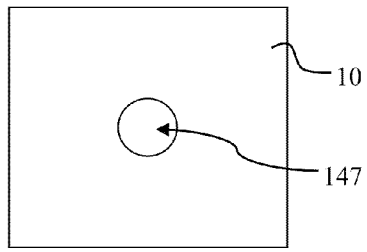 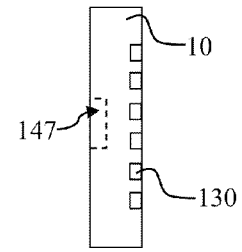 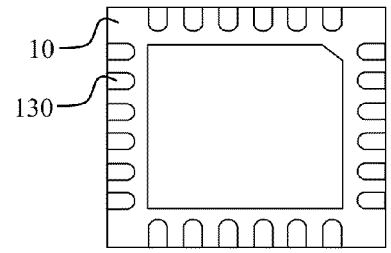
FIGURE 5A  FIGURE 5B  FIGURE 5C
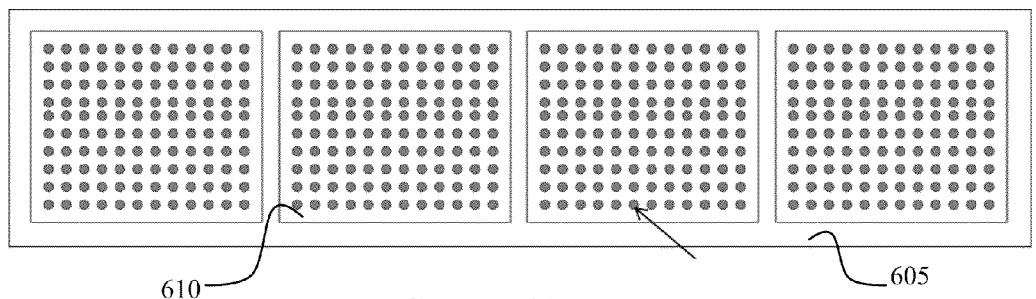
FIGURE 6A
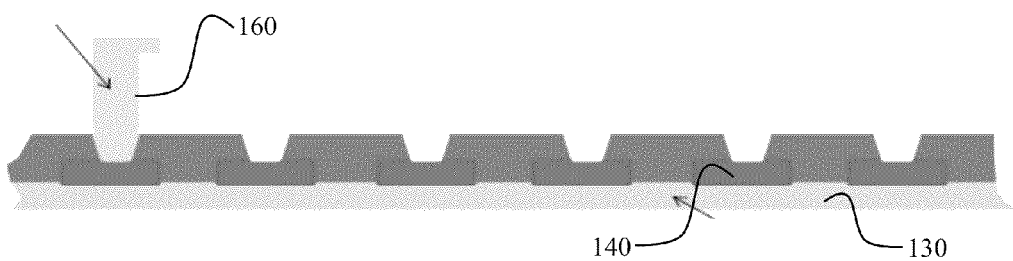
FIGURE 6B

OPEN CAVITY PLASTIC PACKAGE

PRIORITY CLAIM

This utility application claims priority to U.S. Provisional Application No. 61/755,889, filed Jan. 23, 2013.

TECHNICAL FIELD

The present disclosure relates to a method for manufacturing open cavity plastic packages for integrated circuits (ICs), in particular, using a cover over the IC die during the encapsulation process to provide a plastic package with an open cavity to allow the device to act as a sensing device.

BACKGROUND

Integrated circuits (ICs) may include sensors for a variety of reasons. For example, ICs may comprise moisture-sensitive sensors to detect liquid or humidity. Manufacturers may include a moisture-sensitive sensor to determine whether an IC has been damaged by immersion in water, so as to know whether a customer returning an IC is entitled to a replacement of the IC under warranty. Other ICs include sensors that are part of the functionality of the IC. For example, ICs have sensors to detect: radio frequency identification, temperature, ambient light, mechanical shock, liquid immersion, humidity, $CO_2$, $O_2$, pH, and ethylene. These IC chips may be used to monitor these ambient conditions.

Integrated circuit devices that operate as sensors may require a specific opening in the package to be able to act as an environmental sensing device. Conventional sensing devices use tape assist in the mold operation to create a cavity in the package. That technology is expensive and there are problems associated with it, in particular, damage to the sensor area (for example, die surface scratches, puncture marks in the sensor area or resin bleed from the molding operation). These problems continue to be the major issues with the tape assist art. Thus, a need exists for a plastic package for use as a housing for an integrated circuit device with an opening providing for a sensing area, wherein the sensing area must be free of resin bleed from the molding operation and must be free of damage.

SUMMARY

According to various embodiments, a spring-loaded solution is provided to resolve all those issues addressed above and make the process of manufacturing of an environmental sensing device even less expensive. According to an embodiment, a retractable spring loaded pin is provided in the mold to create an open cavity molded package. The open cavity concept is used to expose a certain sensor area to the environment (for example, a specific top area of an integrated circuit die). It is important that, during the manufacturing process, the sensor area is not scratched, punctured, nor covered with any resin residue from the mold operation. According to various embodiments, all those issues are resolved, and the sensor device can be economically produced.

According to various embodiments, a cavity or hole is created in a plastic package such that there will be no resin bleed from mold flash nor can there be any damage to the sensor area. To achieve these objects, a retractable spring-loaded pin or pins are used within the mold to create the cavity (for example, in a top half of a mold). The spring-loaded pins actually retracts back when the mold is closed and thus protect the sensor area on the silicon die from being covered by mold compound.

One aspect of the invention provides a method for manufacturing open cavity integrated circuit packages, the method comprising: placing a wire-bound integrated circuit in a mold; forcing a pin to contact a die of the wire-bound integrated circuit by applying a force between the pin and the mold; injecting plastic into the mold; allowing the plastic to set around the integrated circuit to form a package having an open cavity defined by the pin; and removing the open cavity integrated circuit package from the mold.

According to another aspect of the invention, there is provided a mold for forming a package for an integrated circuit sensor device, comprising: a bottom part for supporting an integrated circuit die; and a top part that is operable to be placed on top of said bottom part to form a cavity into which a plastic material can be injected to form the package, wherein the top part of the mold comprises a spring loaded pin arrangement comprising a cover that covers a sensor area on the integrated circuit die and provides for an opening when the plastic material is injected.

Still another aspect of the invention provides a process of manufacturing a sensor device comprising: placing an integrated circuit die on a support placed on a bottom part of a mold; wire-bonding the integrated circuit die; placing a top part of a mold on top of said bottom part to form a cavity for a package, wherein the top part of the mold comprises a spring-loaded pin arrangement comprising a cover that covers a sensor area on the integrated circuit die; and injecting plastic material into the mold formed by the top and bottom part, wherein the cover provides for an opening in the package formed by said injected plastic material.

BRIEF DESCRIPTION OF THE DRAWINGS

FIGS. 5A-5C show top, side, and bottom views of an IC package 10 of an environmental sensor using a TQFN package;

FIGS. 6A and 6B show a lead frame and a top mold cavity design for an array of sensor device.

DETAILED DESCRIPTION OF INVENTION

Figure 1A:
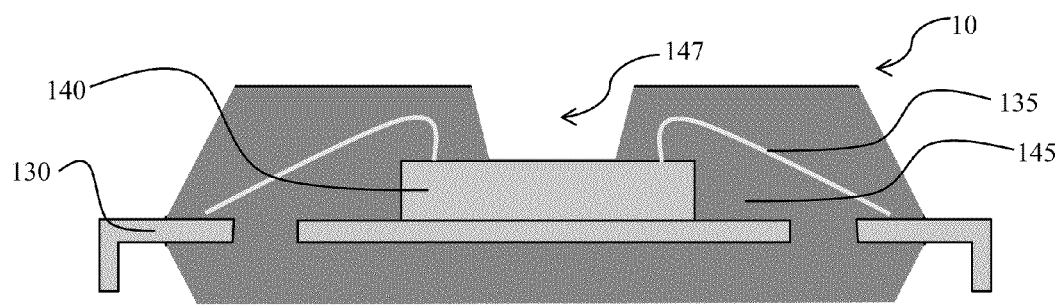
FIGS. 1A and 1B illustrate a cross-sectional side view and a top view of an open cavity plastic IC package 10 made by the process of the present invention.
Figure 1B:
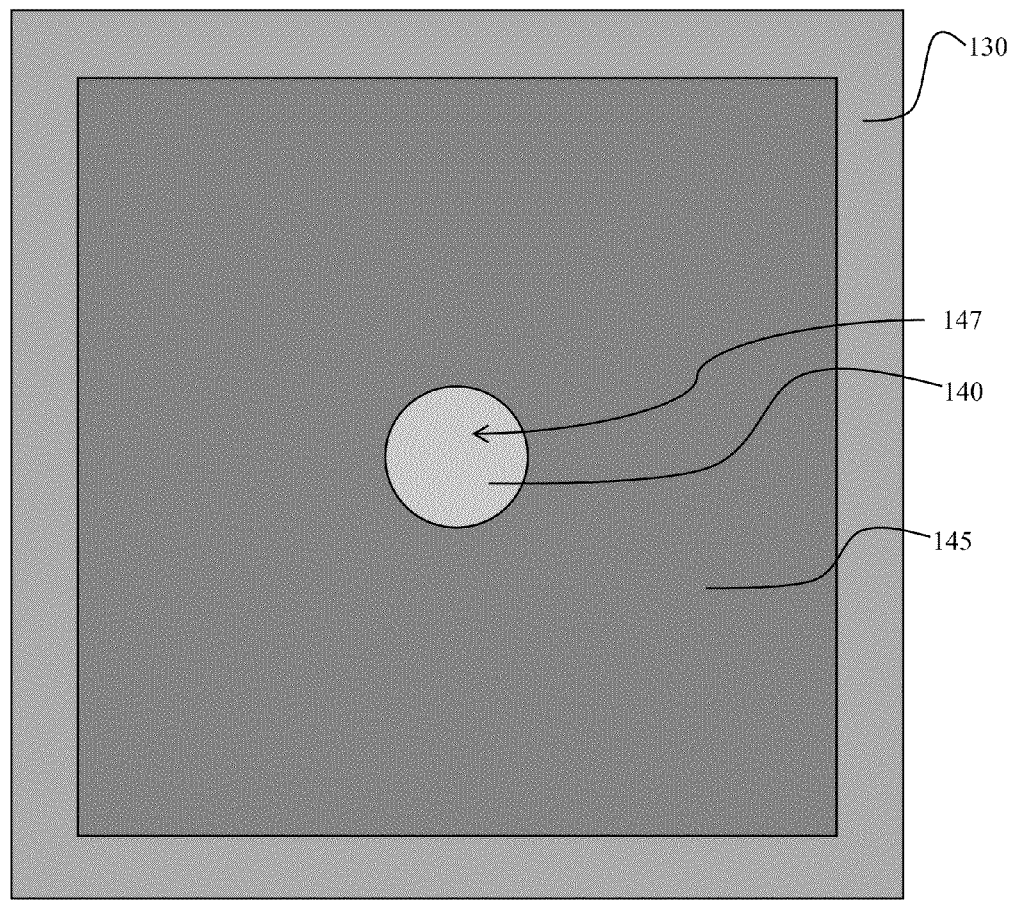

FIGS. 1A and 1B illustrate a cross-sectional side view and a top view of an open cavity plastic IC package 10 made by the process of the present invention. The open cavity plastic IC package 10 has a die 140 positioned on a lead frame 130. Bond wires 135 extend from the die 140 to the lead frame 130. The IC package 10 is covered with a plastic encapsulant 145, which provides a sensor port or an open cavity 147 for a sensor on the die 140 to have access to the ambient conditions in which the IC package 10 may be placed.

Figure 1C:
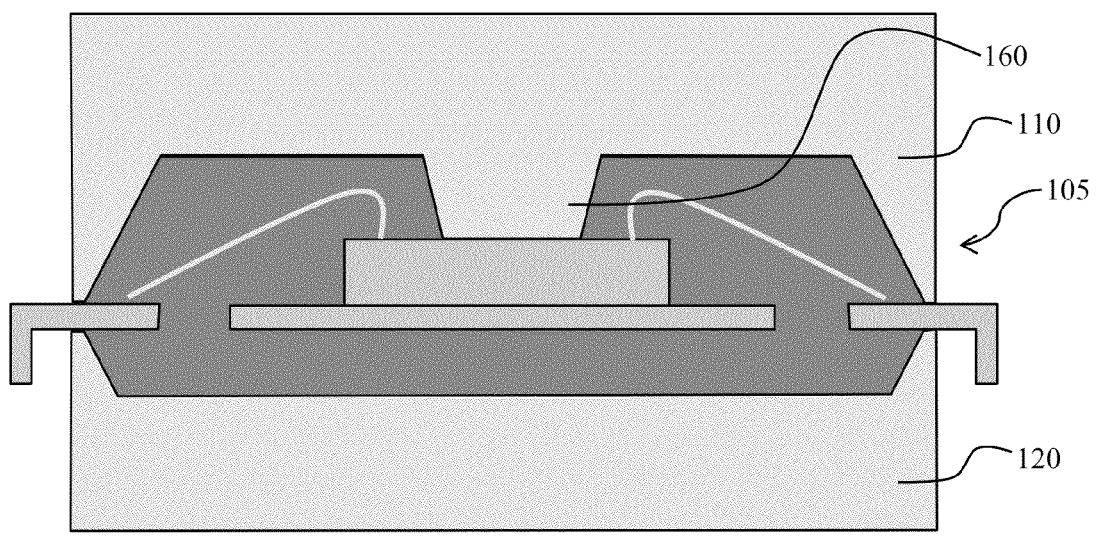
FIG. 1C illustrates a cross-sectional side view of the IC package 10 of FIGS. 1A and 1B in a mold 105.

FIG. 1C illustrates a cross-sectional side view of the IC package 10 of FIGS. 1A and 1B in a mold 105. During the manufacturing process, encapsulant in the form of a molding compound is pumped into the mold to cover the interconnects or bond wires. The mold 105 comprises two half-shell molds: a top part of the mold 110 and a bottom part of the mold 120. The top part 110 of the mold has a pin 160 that contacts the upper surface of the die 140 when the mold is assembled on the lead frame 130. The pin 160 prevents the plastic encapsulant from forming a cover in the area above the die 140 so that an open cavity 147 may be formed.

Figure 2:
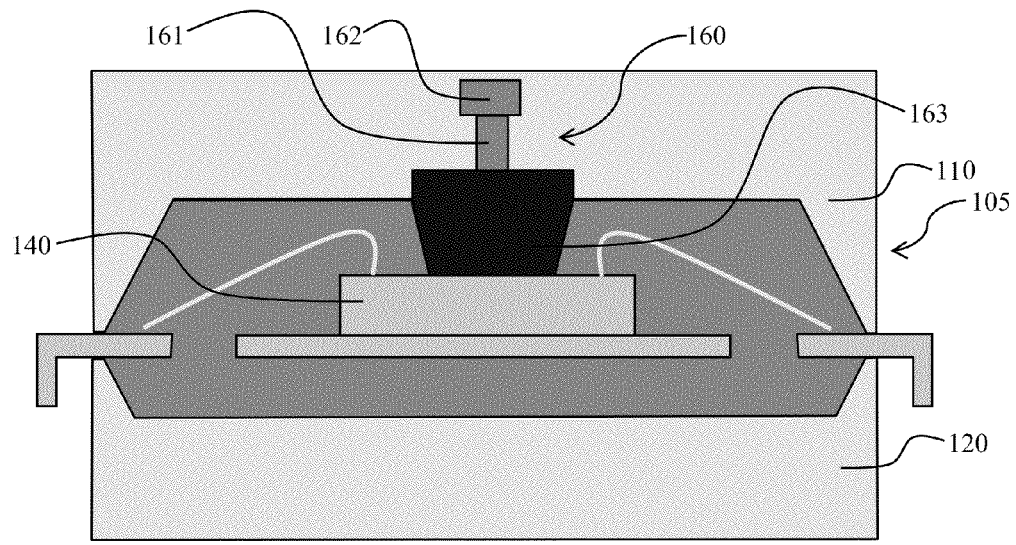
FIG. 2 illustrates a cross-sectional side view of an IC package in a mold of the present invention.

FIG. 2 illustrates a cross-sectional side view of an IC package in a mold of the present invention. The top part 110 of the mold 105 comprises a pin 160. The pin 160 has a pin head 163, which contacts the die 140. The pin 160 also has a force element 161 and an anchor element 162. The anchor element 162 holds the pin 160 in the top part 110 of the mold 105. The force element 161 is connected at one end to the anchor element 162 and at the other end to the pin head 163. The force element 162 pushes the pin head 163 away from the anchor element 162 toward the die 140. The force element may take any form known to persons of skill in the art, such as a spring, a piston, an elastic rod, a magnetic rod, etc., wherein it has the capacity to force the position of the pin head 163 toward the die 140. To provide more uniform contact between the pin head 163 and the die 140, the pin head 163 may be flexibly or pivotably attached to the force element 161. A flexible or pivotable attachment may allow the pin head 163 to adjust its contact face to align with the die 140. This alignment may be particularly beneficial where the die is thicker on one side and relatively thinner on another side, or if the die is not perfectly bonded to the lead frame so as to be the same height at all points.

As IC dies may vary in thickness, the force element works beyond its means to protect the sensor area. Conventional manufacturing devices use a fixed pin and a high-temperature tape to protect the sensor area and form the open cavity. However, because fixed pins may apply different contact pressures to IC dies, depending on the IC die thicknesses, plastic encapsulate or resin may bleed or flow into the open cavity where the sensor is to be positioned or is positioned on the IC die. Further, use of a fixed pin and high-temperature tape may require additional process steps to remove the high-temperature tape. During the removal process, the sensor is further exposed and could be damaged. This conventional process uses a very expensive high-temperature tape to cover the sensor area during encapsulation and then an additional process to remove the high temperature tape from the open cavity either manually or using vacuum. These extra steps add to the unit cost. Also, additional process steps have their own process issues, i.e., they may scratch the sensor or cause resin to bleed into the open cavity over the sensor.

The force or spring-loaded concept according to various embodiments of the invention has been proven not to cause any damage to the sensor area. The technology according to various embodiments utilizes a spring-loaded pin similar to a spring-loaded pogo pin technology only present in equipment handlers for piece part testing (for example, to provide electrical connection of a test device with bond pads on a silicon die).

According to an embodiment, a spring load pogo or pin is used in the transfer molding process to create an opening in plastic packages such as in a Thin Quad Flat No Lead package. A similar concept can be applied to any other plastic package that is used in, for example, a gas or pressure sensor application that requires an opening to expose a sensor area of the device.

Using a spring-loaded bin a mold (for example in the top half of a mold), provides an economically sound process without causing any sort of damage to the sensor areas. The spring loaded cavity package furthermore will not cause any damage during the transfer molding process.

Figure 3:
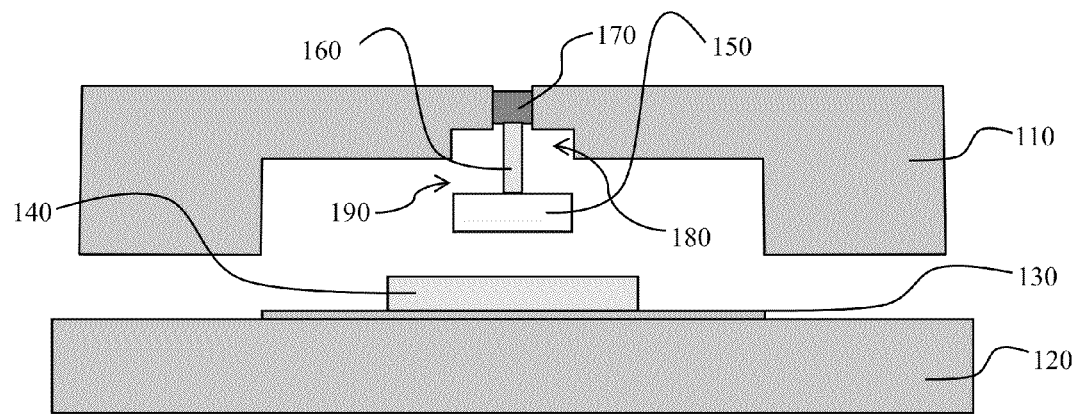
FIG. 3 shows a two-part mold according to various embodiments.

FIG. 3 shows a two-part mold according to various embodiments. The bottom part 120 of the mold provides support for a die 140, which may be placed on a lead frame 130. The top part 110 includes the spring-molded pin arrangement 190, wherein a pin 160 supporting a cover 150 provides for a cover of the sensor area that may be arranged in the center of the die 140 on the lead frame 130. The spring can be arranged inside a spring housing 170 and extends the cover 150 into or beyond the hollow space 100 when the top part 110 of the mold is not placed on the bottom part 120 as shown in FIG. 3. Once the top part 110 of the mold is placed onto the bottom part 120, the spring-loaded pin 160 is pushed back by the die 140. An additional opening 180 can be provided to retract the cover 150. The extension length is designed such that the cover portion 150 of the spring loaded pin arrangement 190 will form an opening in the housing. The spring-loaded pin arrangement 190 further provides for automatic adjustment depending on the thickness of the die 140. Thus, a single top mold part 110 can be used with various die thicknesses. Once the mold is closed by putting the top part 110 of the mold on top of the bottom part 120, plastic can be injected into the hollow space 100 to encompass and seal the die 140 within the housing and at the same time form the opening in the top portion of the housing. Retracting the top part of the mold leaves the sensing device package completed without damage to the sensor area.

Figure 4A:
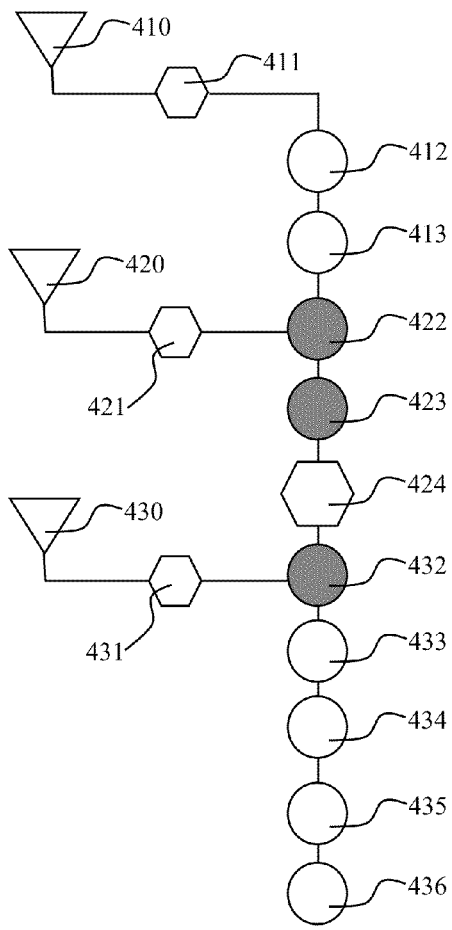
FIG. 4A shows the manufacturing process in the form of a flow chart for an IC package of the present invention.
Figure 4B:
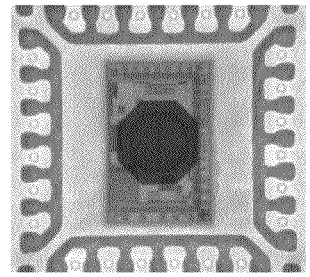
FIG. 4B illustrates an IC at the end of the die attach sub-process.

FIG. 4A shows the manufacturing process in the form of a flow chart for an IC package of the present invention, wherein the process comprises three sub-processes: die attach, wire bonder, and molding. For the die attach sub-process, a supply of wafers 410 is brought into the process for inspection 411. The wafers are then mounted 412 and sawed 413. Dies are then attached 422 to the lead frames. A machine, such as an ASM AD898 may be used, wherein the machine may have an automatic wafer handling system with water cassette elevator for up to 8-inch wafers. Such a machine may be capable of handling die sizes from 0.25 mm×0.25 mm to 25.4 mm×25.4 mm. The machine may also apply a bond force of 30-2000 g and provide multi-grey levels PRS. FIG. 4B illustrates an IC at the end of the die attach sub-process.

Figure 4C:
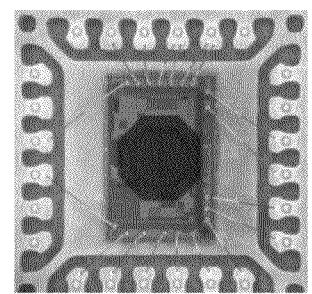
FIG. 4C illustrates an IC at the end of the wire bonder sub-process.

Referring again to FIG. 4A, for the wire bonder sub-process, a supply of lead frames 420 is brought into the process for inspection 421. Bond wires are then made to bond 423 the dies to the lead frames. A step called $3^{rd}$ Optical QA 424 is then performed. This sub-process creates wire-bound integrated circuits. A machine such as an ASM Eagle-60 or equivalent may be used. The wire size may be 15 um to 50.8 um Au. The maximum length of the wires may be 8 mm. The bonding speed may be 60+ ms for 2 mm wire. The bond placement accuracy may be ±3.0 um. The bonding area may be 54 mm×65 mm. FIG. 4C illustrates an IC at the end of the wire bonder sub-process.

Figure 4D:
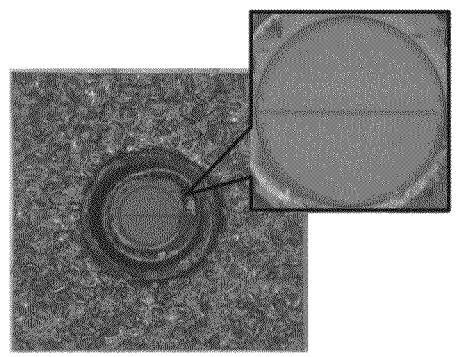
FIG. 4D illustrates an IC at the end of the molding sub-process.

Referring again to FIG. 4A, for the molding sub-process, a supply of compound 430 is brought into the process for inspection 431. The wafers are then molded 432 to form the IC packages. The wafers are then marked 433. A saw singulation step 434 is then performed to separate the IC packages. A visual inspection 435 is performed, and the ICs are then packed and shipped 436. An ASAHI Cosmo-T machine may be used for the molding sub-process. The mold temperature may be 180° C.±5° C. The transfer pressure may be 35 kgf. The clamp tonnage may be 45 ton. The in-mold cure time may be 90 seconds. FIG. 4D illustrates an IC at the end of the molding sub-process.

Materials known to persons of skill in the art may be used to manufacture the ICs. For example, the lead frame may be μPPF 0.2 mm thick, wherein the pad size may be 2.90 mm×2.90 mm and the exposed pad size may be 2.60 mm×2.60 mm. The die-attached epoxy may be Sumitomo CRM1076NS. Gold wire may be used having a diameter of MKE 0.8 mils. A mold compound may be Sumitomo G770HCD, wherein the pellet size may be 14×6.0 g.

FIGS. 5A-5C show top, side, and bottom views of an IC package 10 of an environmental sensor using a TQFN package. The depth of the open cavity 147 may be about 0.35 mm±0.05, and the diameter of the open cavity 147 may be about 1 mm, for a package that is about 4 mm square. The lead frame 130 is visible from the side and bottom, as shown in FIGS. 5B and 5C, respectively.

FIGS. 6A and 6B show a lead frame and a top mold cavity design for an array of sensor devices, wherein FIG. 6A is a top view of the entire array 605, and FIG. 6B is a cross-sectional side view of a portion of the array 605. The exemplary top mold cavity design has four panels 610, wherein each panel 610 is a 10×12 a for an array 610 having a total of 480 ICs. Each panel 610 has a lead frame 130 with an array of dies 140, wherein a pin 160 is used relative to each die 140 to form an open cavity for a sensor on the die. According to one embodiment, the array 605 may be a TQFN top mold cavity design for TQFN 4×4 pressure sensor.

Figure 7A:
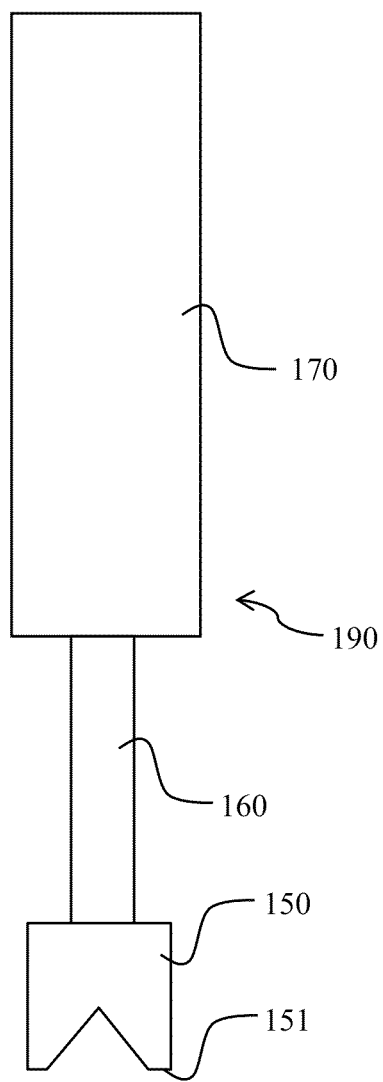
FIGS. 7A and 7B show an exemplary embodiment of the spring-loaded pin arrangement according to various embodiments.
Figure 7B:
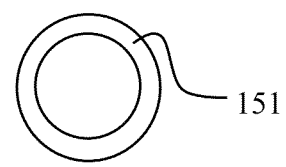

FIGS. 7A and 7B show an exemplary embodiment of the spring-loaded pin arrangement according to various embodiments. FIG. 7A is a side view of a spring-molded pin arrangement 190. The spring-molded pin arrangement 190 comprises a spring housing 170, a pin 160, and a cover 150. FIG. 7B is an end view of the cover 150. The cover 150 has an annular contact face 151 that allows the cover 150 to make more uniform contact with the die 140 (see FIG. 3) to prevent flashing of the plastic encapsulant into the open cavity 147 (see FIG. 1A). The outside diameter of the cover 150 may be about 1.2 mm, and the inside diameter of the conical recess in the cover 150 may be about 1.0 mm, so that the annular contact face 151 may be about 0.1 mm wide. The spring-molded pin arrangement 190 may be constructed of material sufficient to endure exposure to plastic encapsulant heated to at least 300° C. The force of the spring inside the spring housing 170 may be about 80-120 g.

In alternative embodiments of the invention, a plurality of open cavities may be formed on a single IC. To form a plurality of open cavities, a plurality of covers 150 or pin heads 163 may be applied to a single IC during a molding sub-process. Where a plurality of pins are independently forced against the die, the independent application of force may ensure that the plastic encapsulant is unable to enter any of the open cavities because the plurality of pins are each able to make a firm contact with the die. Alternatively, a single cover 150 or pin head 163 may be applied to a single IC during a molding sub-process, but the single cover 150 or pin head 163 comprises a plurality of contact faces 151. In the embodiment illustrated in FIG. 7B, the contact face 151 is annular, but in alternatively embodiments, the contact face may be any shape or configuration and may comprise a plurality of contact faces. A plurality of open cavities 147 may be useful where a plurality of sensors are attached to a single IC.

The invention claimed is:

1. A process of manufacturing a sensor device comprising the steps of:
    placing an integrated circuit die on a support placed on a bottom part of a mold;
    wire-bonding the integrated circuit die;
    placing a top part of a mold on top of said bottom part to form a cavity into which a plastic material can be injected to form a package, wherein the top part of the mold comprises a spring-loaded pin arrangement comprising a cylindrical cover having a conical recess that covers a sensor area on the integrated circuit die; and
    injecting plastic material into the mold formed by the top and bottom part, wherein the cylindrical cover provides for an opening in the package formed by said injected plastic material, wherein a pin extends from the cylindrical cover and is guided within a spring housing wherein the pin can be vertically moved against a spring force.

2. A process of manufacturing a sensor device as claimed in claim 1, wherein the placing a top part of a mold on top of said bottom part to form a cavity for a package comprises applying a force to the integrated circuit die independent of the closure force of the top part of the mold.

3. A process of manufacturing an open cavity integrated circuit package, the method comprising:
    providing a mold comprising a bottom part for supporting an integrated circuit die, a top part that is operable to be placed on top of said bottom part to form a cavity into which a plastic material can be injected to form the package, wherein the top part of the mold comprises a spring-loaded pin arrangement comprising a cylindrical cover having a conical recess that covers a sensor area on the integrated circuit die and wherein the top part provides for an opening to allow injection of the plastic material, a pin extending from the cylindrical cover and guided within a spring housing wherein the pin can be vertically moved against a spring force;
    placing a wire-bound integrated circuit in the mold;
    forcing the pin to contact the die of the wire-bound integrated circuit by applying a force between the pin and the mold;
    injecting plastic into the mold;
    allowing the plastic to set around the integrated circuit to form a package having an open cavity defined by the cylindrical cover; and
    removing the open cavity integrated circuit package from the mold.

4. A process of manufacturing an open cavity integrated circuit package as claimed in claim 3, wherein the forcing a pin to contact a die comprises applying a spring force.

5. A process of manufacturing an open cavity integrated circuit package as claimed in claim 3, wherein the forcing a pin to contact a die comprises applying a piston force.

6. A process of manufacturing an open cavity integrated circuit package as claimed in claim 3, wherein the forcing a pin to contact a die comprises applying an elastic rod force.

7. A process of manufacturing an open cavity integrated circuit package as claimed in claim 3, wherein the forcing a pin to contact a die comprises contacting the die with an annular contact face of the pin.

8. A process of manufacturing an open cavity integrated circuit package as claimed in claim 3, wherein the forcing a pin to contact a die comprises forcing a plurality of pins to contact a die, and wherein the allowing the plastic to set comprises allowing the plastic to set around the plurality of pins to form a plurality of open cavities defined by the plurality of pins.

9. A process of manufacturing an open cavity integrated circuit package as claimed in claim 3, wherein the forcing a pin to contact a die comprises forcing a pin having a plurality of contact faces to contact a die, and wherein the allowing the plastic to set comprises allowing the plastic to set around the plurality of contact faces to form a plurality of open cavities defined by the plurality of contact faces.

10. A process of manufacturing an open cavity integrated circuit package as claimed in claim 3, further comprising pivoting the pin relative to the mold for uniform contact of a pin contact face with the die.

11. A process of manufacturing an open cavity integrated circuit package as claimed in claim 3, wherein the placing a wire-bound integrated circuit in a mold comprises placing an array of wire-bound integrated circuits in a mold; wherein forcing a cylindrical cover to contact the die comprises forcing a corresponding array of pins to contact the dies of the array of wire-bound integrated circuits; and wherein allowing the plastic to set comprises allowing the plastic to set around the array of integrated circuit to form an array of packages having open cavities defined by the array of pins.

12. A process of manufacturing an open cavity integrated circuit package as claimed in claim 3, wherein the placing a wire-bound integrated circuit in a mold comprises closing the mold by applying a first force to the mold, wherein the forcing a pin to contact a die comprises applying a second force to the pin, wherein the first and second forces are different.

\* \* \* \* \*